(12) United States Patent
Bouillet

(10) Patent No.: US 7,706,490 B2
(45) Date of Patent: Apr. 27, 2010

(54) ANALOG TO DIGITAL CONVERTER CLOCK SYNCHRONIZER

(75) Inventor: Aaron Reel Bouillet, Noblesville, IN (US)

(73) Assignee: Thomson Licensing, Boulogne Billancourt (FR)

( * ) Notice: Subject to any disclaimer, the term of this patent is extended or adjusted under 35 U.S.C. 154(b) by 849 days.

(21) Appl. No.: 10/587,287

(22) PCT Filed: Feb. 2, 2004

(86) PCT No.: PCT/US2004/002913

§ 371 (c)(1),
(2), (4) Date: Jul. 25, 2006

(87) PCT Pub. No.: WO2005/081449

PCT Pub. Date: Sep. 1, 2005

(65) Prior Publication Data

US 2008/0272813 A1 Nov. 6, 2008

(51) Int. Cl.
*H04L 7/00* (2006.01)
(52) U.S. Cl. .................................. 375/355; 375/376
(58) Field of Classification Search .............. 375/316, 375/354, 355, 371, 373, 376
See application file for complete search history.

(56) References Cited

U.S. PATENT DOCUMENTS

| 4,814,879 | A | 3/1989 | McNeely | |
|---|---|---|---|---|
| 6,496,042 | B1 | 12/2002 | Nishikawa | |
| 2003/0117190 | A1* | 6/2003 | Ito | 327/156 |
| 2004/0062336 | A1* | 4/2004 | Kuwata et al. | 375/376 |
| 2005/0007493 | A1* | 1/2005 | Renner et al. | 348/547 |

OTHER PUBLICATIONS

European Search Report dated Mar. 21, 2005.

* cited by examiner

*Primary Examiner*—David B Lugo
(74) *Attorney, Agent, or Firm*—Robert D. Shedd; Joseph J. Opalach; Brian J. Cromarty

(57) ABSTRACT

The present application generally relates to apparatuses such as television signal processing apparatus that process radio frequency signals. More specifically, the present application is particularly useful in integrated circuits that must receive a radio frequency signal and simultaneously use circuitry where the timing of the operations are based on the received RF signal and circuitry where the timing is based on a fixed rate signal with sensitivity to clock jitter. According to an exemplary embodiment, the apparatus comprises, a first input (RefClk), a second input (PllClk), an output (CLK 1X), a delay means (405, 410, 415, 420, 425), and a logic means (430, 435, 440, 445, 450, 455, 460, 465, and 470) to compare a plurality of stages of said delay means to produce an signal at said output.

14 Claims, 5 Drawing Sheets

ANALOG TO DIGITAL CONVERTER CLOCK SYNCHRONIZER

This application claims the benefit, under 35 U.S.C. §365 of International Application PCT/US2004/002913, filed Feb. 2, 2004 which was published in accordance with PCT Article 21(2) on Sep. 2, 2005 in English.

FIELD OF THE INVENTION

The present application generally relates to apparatuses such as a signal processing apparatus. More specifically, the present application is particularly useful in integrated circuits that must receive a radio frequency signal and simultaneously use circuitry where the timing of the operations are based on the received RF signal and circuitry where the timing is based on a fixed rate signal with sensitivity to clock jitter.

BACKGROUND OF THE INVENTION

The present application generally relates to apparatuses such as television signal processing apparatus, that process radio frequency signals. More specifically, the present application is particularly useful in integrated circuits that must combine circuitry operating in a synchronous-sampling mode that must be adapted for use with a fixed rate sampling mode application.

Modern signal processing apparatus typically include signal processing circuitry for processing a multitude of signal formats, such as NTSC, ATSC, QAM, or satellite signals. Such a signal processing apparatus typically includes various components such as a tuner for selecting a particular signal or channel from a plurality of signals or channels received by the apparatus. To process digital signals, such as ATSC or satellite signals, the signal processing circuitry, and in particular the tuner, must perform these functions with high-speed digital circuitry. Some digital signal processing apparatus operate in a synchronous-sampling mode, where the A/D converter takes samples coincident with the digital symbol locations. The digital symbols, and subsequently the sampling frequency are calculated by the demodulator and a rate control signal is output from the demodulator to control the sampling rate of the A/D. It is also possible to take samples using an A/D converter at a fixed time intervals.

It is often a major design change in terms of time and expense to convert a design originally intended to operate in synchronous-sampling mode to operate in a fixed-rate sampling mode. This is primarily due to the requirement for an enable signal to be provided to all of the memory elements in the design. An enable signal is required throughout the design to identify when processing is to proceed since the demodulator is running at a high rate and not every clock signal is accompanied by a digital symbol. A thorough knowledge of the original design is usually required to effectuate the design change and re-verification is required to be carried out. In situations of design reuse, it would be advantageous to introduce a preprocessing block that can convert the fixed rate samples to synchronous samples without requiring the necessity of an enable line.

In digital signal processing applications there are typically many different clocks used to drive the processing circuitry. These clocks are typically derived from a phase-locked loop (PLL). When the data is gathered through an A/D converter, using the PLL output to clock the A/D converter can degrade its performance as high speed A/D converters are sensitive to clock jitter. When an external clock is used to drive the A/D converter, a synchronization problem arises because of the unknown phase between the A/D clock and the PLL output clock. Previously, designers have used clock resynchronizers or back to back flip flops on the reference clock and PLL clock lines. This solution is based on the assumption that a "bad phase" occurs only some of the time. However, if the system starts up in the "bad phase" it will continue to operate constantly at the bad phase. This results in the data latching and putting the system into an unstable state. Therefore the robustness of the back-to-back flip flop approach is questionable. It is desirable to have an A/D clock to be used by the digital signal processing circuitry that is synchronized to the PLL output clock to facilitate latching the A/D output and preventing problems associated with clock jitter.

SUMMARY OF THE INVENTION

In accordance with an aspect of the present invention, a signal processing apparatus comprising a source of a first input signal, a source of a second input signal, a delay means comprising a plurality of outputs for delaying the first input signal responsive to the second input signal, and a means to compare said plurality of outputs of the delay means to produce a first output signal.

BRIEF DESCRIPTION OF THE DRAWING

The above-mentioned and other features and advantages of this invention, and the manner of attaining them, will become more apparent and the invention will be better understood by reference to the following description of embodiments of the invention taken in conjunction with the accompanying drawings, wherein.

DETAILED DESCRIPTION OF THE PREFERRED EMBODIMENT

The exemplifications set out herein illustrate preferred embodiments of the invention, and such exemplifications are not to be construed as limiting the scope of the invention in any manner.

Figure 1:
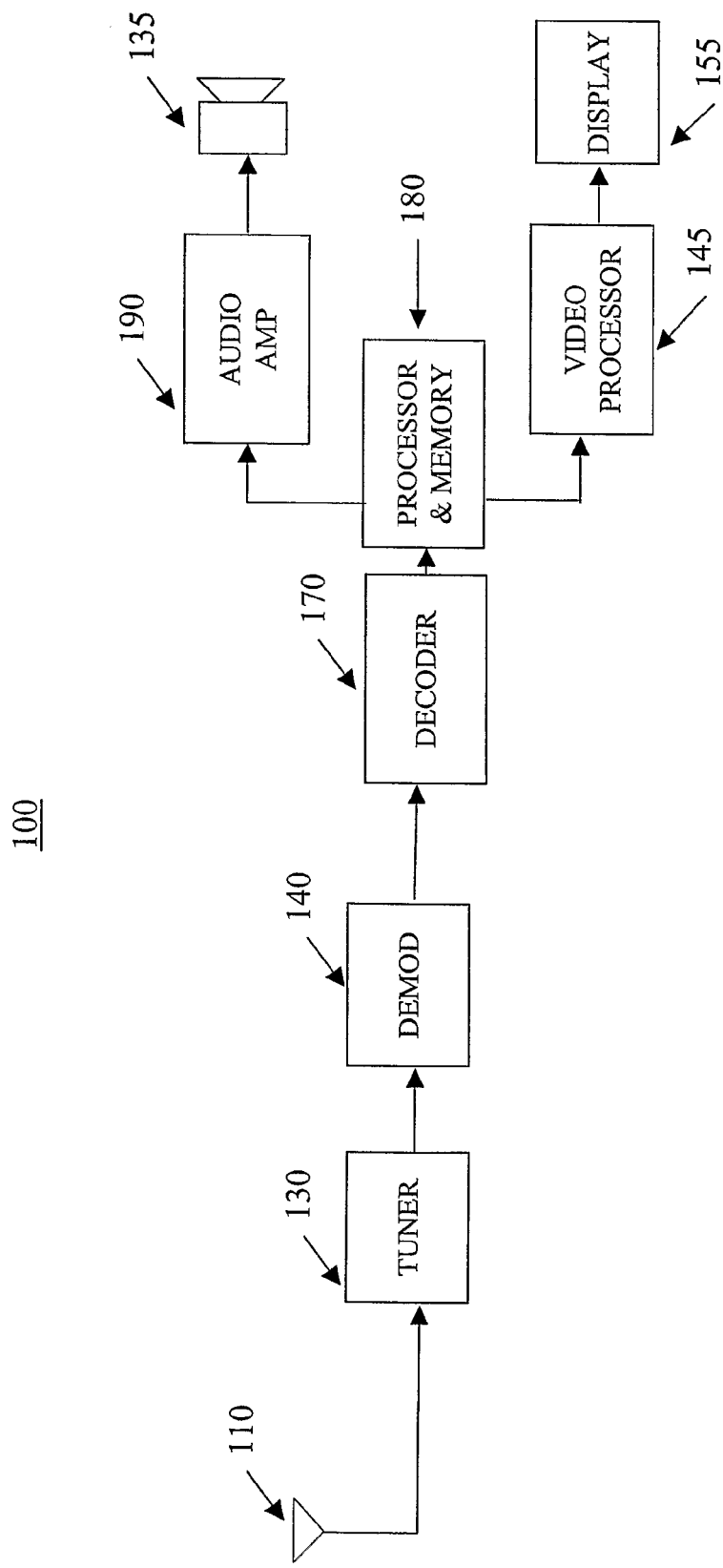
FIG. 1 is a block diagram of a television signal processing apparatus according to an exemplary embodiment of the present invention.

Referring to FIG. 1, a block diagram of an exemplary embodiment of television signal processing apparatus 100 is shown. In FIG. 1, television signal processing apparatus 100 comprises signal receiving means such as signal receiving element 110, tuning means such as tuner 130, demodulation means such as demodulator 140, decoding means such as decoder 170, processing means and memory means such as processor and memory 180, audio amplification means such as audio amplifier 190, audio output means such as speaker 135, video processing means such as video processor 145, and visual output means such as display 155. Some of the foregoing elements may for example be embodied using integrated circuits (ICs). For clarity of description, certain conventional elements of television signal processing apparatus 100 including control signals may not be shown in FIG. 1. According to an exemplary embodiment, television signal processing apparatus 100 may receive and process signals in analog and/or digital formats.

Signal receiving element 110 is operative to receive signals including audio, video and/or auxiliary data from signal sources, such as radio frequency broadcast signal transmission sources, or cable television transmission. Signal receiving element 110 may be embodied as any signal receiving element such as an antenna, input terminal or other element.

Tuner 130 is operative to tune signals including audio, video and/or auxiliary data signals. Accordingly, tuner 130 may tune signals for the main picture of television signal processing apparatus 100. According to an exemplary embodiment, television signal processing apparatus 100 may further include a picture-in-picture (PIP) function wherein the first channel includes audio and/or video signals for a main picture, and a second channel (not shown) includes audio and/or video signals for the PIP function. Demodulator 140 is operative to demodulate signals provided from tuner 130, and may demodulate signals in analog and/or digital transmission formats.

Decoder 170 is operative to decode signals including audio, video and/or auxiliary data signals provided from the demodulator 140. According to an exemplary embodiment, decoder 170 decodes digital data that represents program guide data or emergency alert signals indicating an emergency event. Decoder 170 may also perform other decoding functions, such as decoding data which represents auxiliary data signals included in the vertical blanking interval (VBI) of an analog television signal.

Processor and memory 180 are operative to perform various processing, control, and data storage functions of television signal processing apparatus 100. According to an exemplary embodiment, processor 180 is operative to process the audio and video signals provided from decoder 170, and may for example perform analog processing, such as National Television Standards Committee (NTSC) signal processing and/or digital processing, such as Motion Picture Expert Group (MPEG) processing.

The processor and memory 180 is also operative to receive the auxiliary data signals from decoder 170 and determine what actions are required based on the auxiliary data received. For example, if EPG data is received, the processor 180 may decide to sort the EPG data and store the data in the processor's associated memory 180. If the processor 180 receives auxiliary data associated with the emergency alert function of television signal processing apparatus 100, it may compare data in the emergency alert signals to user setup data stored in memory 180 to determine whether the emergency alert function is activated to activate emergency alert signals.

Audio amplifier 190 is operative to amplify the audio signals provided from processor 180. Speaker 135 is operative to aurally output the amplified audio signals provided from audio amplifier 190.

Video processor 145 is operative to process the video signals provided from processor 180. According to an exemplary embodiment, such video signals may include information based on the data contained in the received auxiliary data signals such as EPG information or emergency alert information. Video processor 145 may include closed caption circuitry that enables closed caption displays. Display 155 is operative to provide visual displays corresponding to processed signals provided from video processor 145.

Figure 2:
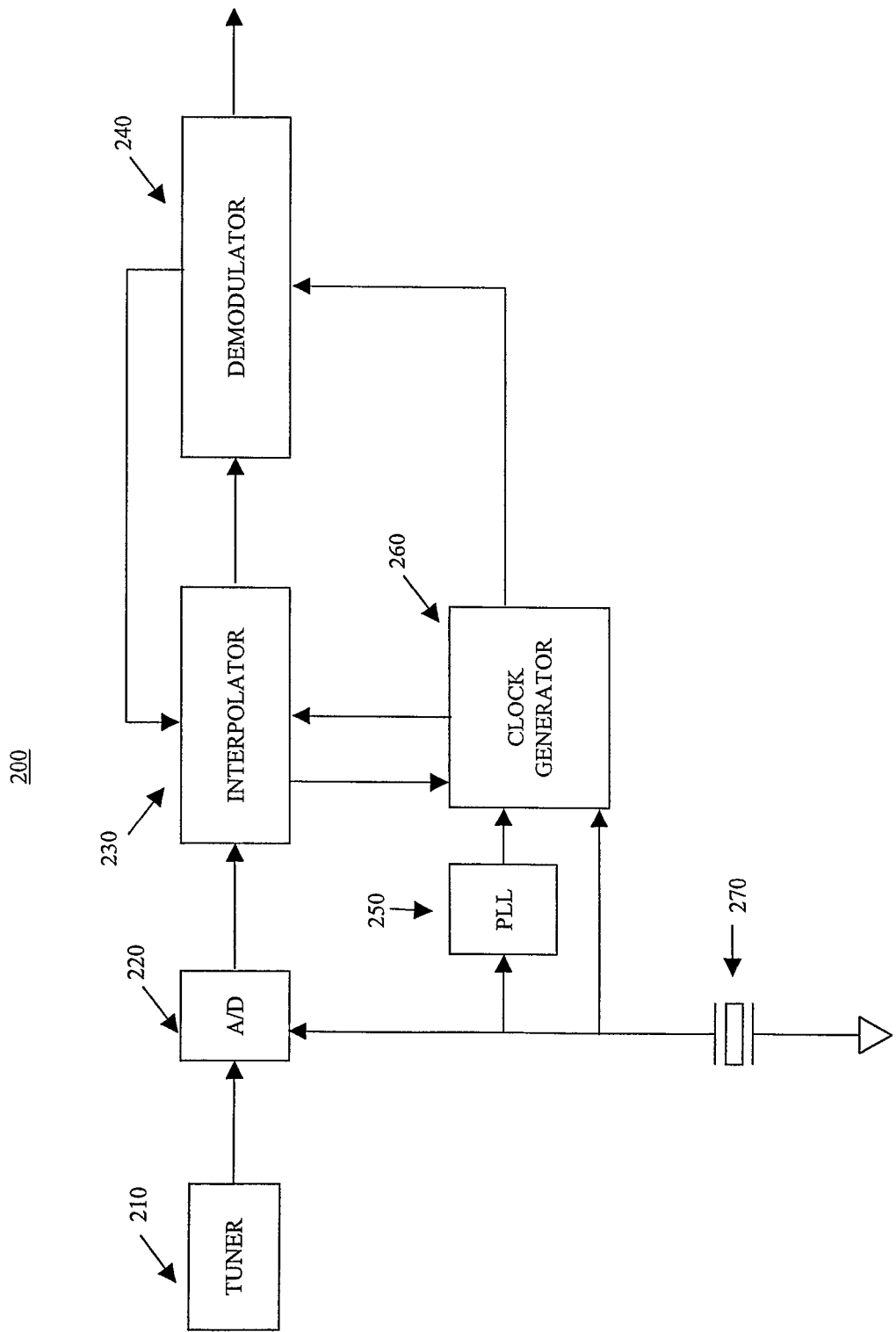
FIG. 2 a block diagram of an exemplary embodiment of digital signal processing circuitry utilizing an A/D converter operating according to a fixed rate sampling mode concurrently with subsequent signal processing circuitry operating according to a synchronous sampling mode.

Referring to FIG. 2, a block diagram of an exemplary embodiment of digital signal processing circuitry 200 comprising A/D converter 220 operating according to a fixed rate sampling mode concurrently with subsequent signal processing circuitry, such as a demodulator 240, operating according to a synchronous sampling mode is shown. The digital signal processing circuitry further comprises a tuner 210, interpolator 230, clock generator 260, and phase locked loop (PLL) 250 as well as a fixed rate clock 270.

In this exemplary embodiment shown in FIG. 2, the tuner 210 outputs an intermediate frequency (IF) analog signal. The A/D converter 220 takes samples of the IF analog signal at a fixed sampling rate. These fixed rate samples are taken at times corresponding to the digital clock signal input into the A/D converter 220 by the fixed rate clock 270. The fixed rate samples are read at the fixed rate by the interpolator 230 and a discrete number of samples are stored by the interpolator 230, the number of samples depending on the interpolation method used by the interpolator 230.

The interpolated samples are then interpolated to yield samples at the symbol rate or some integer multiple thereof in the Interpolator 230 based on the rate control signal from the demodulator 240. In a synchronous sampling mode of operation, the rate control signal might have originally been used to control the frequency of a voltage controlled oscillator (VCXO). As such, the interpolator 230 is designed such that its rate control input has the effect of mimicking the effect of this rate control signal going to a VCXO on the data samples delivered to demodulator 240. The interpolator 230 operates using the fixed rate clock 270, whereas the demodulator 240 runs on a burst clock generated by the clock generator 260. The burst clock is enabled by the interpolator 230 when there are samples in the interpolator 230 ready to be processed by the demodulator 240. There may be more than one clock frequency generated by the clock generator 260 going to the demodulator 240 and subsequent synchronous sampling mode circuitry. All of these clocks are allowed to run for 1 symbol of time for every symbol extracted from the interpolator 230. For example, a clock running at 8 times the symbol rate would be allowed to run for 8 periods for every symbol taken from the interpolator 230.

Figure 3:
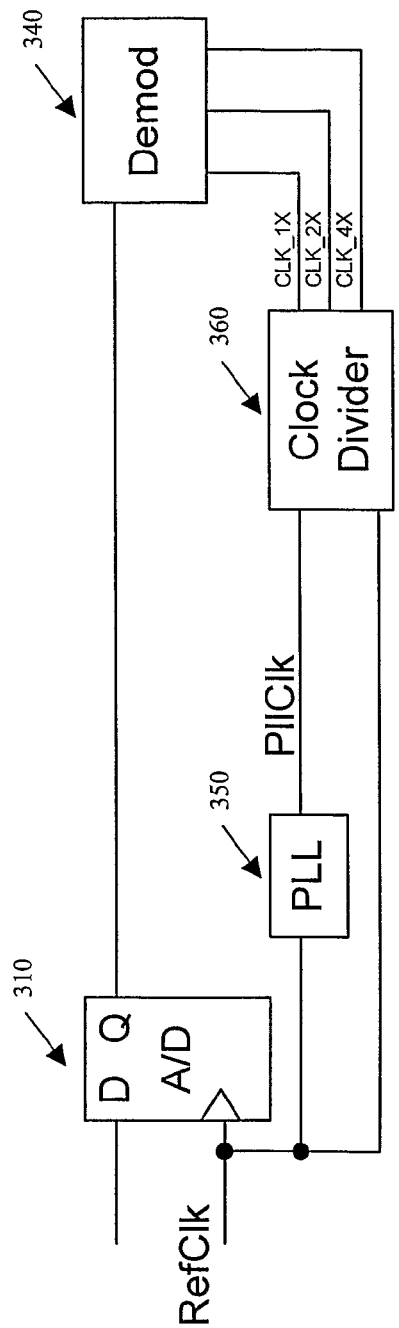
FIG. 3 a block diagram of clock generator circuitry according to an exemplary embodiment of the present invention.

Referring to FIG. 3, a block diagram of clock generator circuitry 300 according to an exemplary embodiment of the present invention is shown. In FIG. 3, the clock generator circuitry 300 comprises an A/D converter 310, a PLL 350, a clock divider 360, and a demodulator 340. The clock divider 360 is used to synchronize the clock generated by the PLL and the reference clock, which is further explained in the discussion of FIG. 4, as well as creating multiple integers of the synchronized clock signal to be used by subsequent signal processing circuitry.

Figure 4:
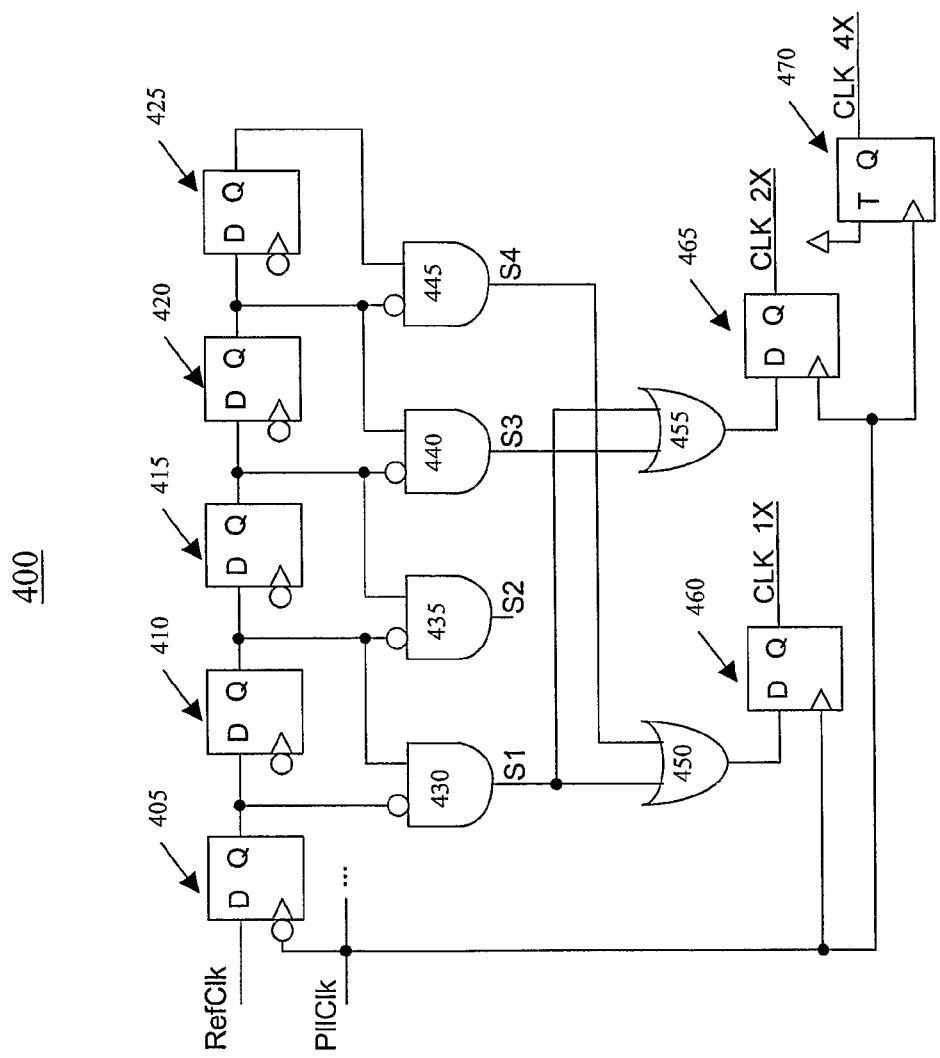
FIG. 4 is a diagram of a clock divider circuitry of a clock generator according to an exemplary embodiment of the present invention.

Referring to FIG. 4, a diagram of a clock divider circuitry 400 of a clock generator according to an exemplary embodiment of the present invention is shown. In FIG. 4, the clock divider circuitry 400 comprises a plurality of D flip-flops 405, 410, 415, 420, 425, 460, 465, 470, a plurality of AND gates 430, 435, 440, 445, a plurality of OR gates 450, 455. In the exemplary embodiment of the present invention shown in FIG. 4, five D flip-flops 405, 410, 415, 420, and 425 are used to create a delay line for the reference clock. The PLL clock is used to advance the state of the delay line. The group of logic elements comprising the AND gates 430, 435, 440, 445 and the OR gates 450, 455 are used as a means for comparing the various output stages of the delay line 405, 410, 415, 420, 425. For example, to generate the 1X clock, the state of the outputs of the first D flip-flop 405, the second D flip-flop 410, the fourth D flip-flop 420, and the fifth D flip-flop are compared using the group of logic elements 430, 435, 440, 445, 450, 455. The 1X clock is then passed through a final D flip-flop 460 to complete the synchronization of the reference clock with the PLL clock.

Figure 5:
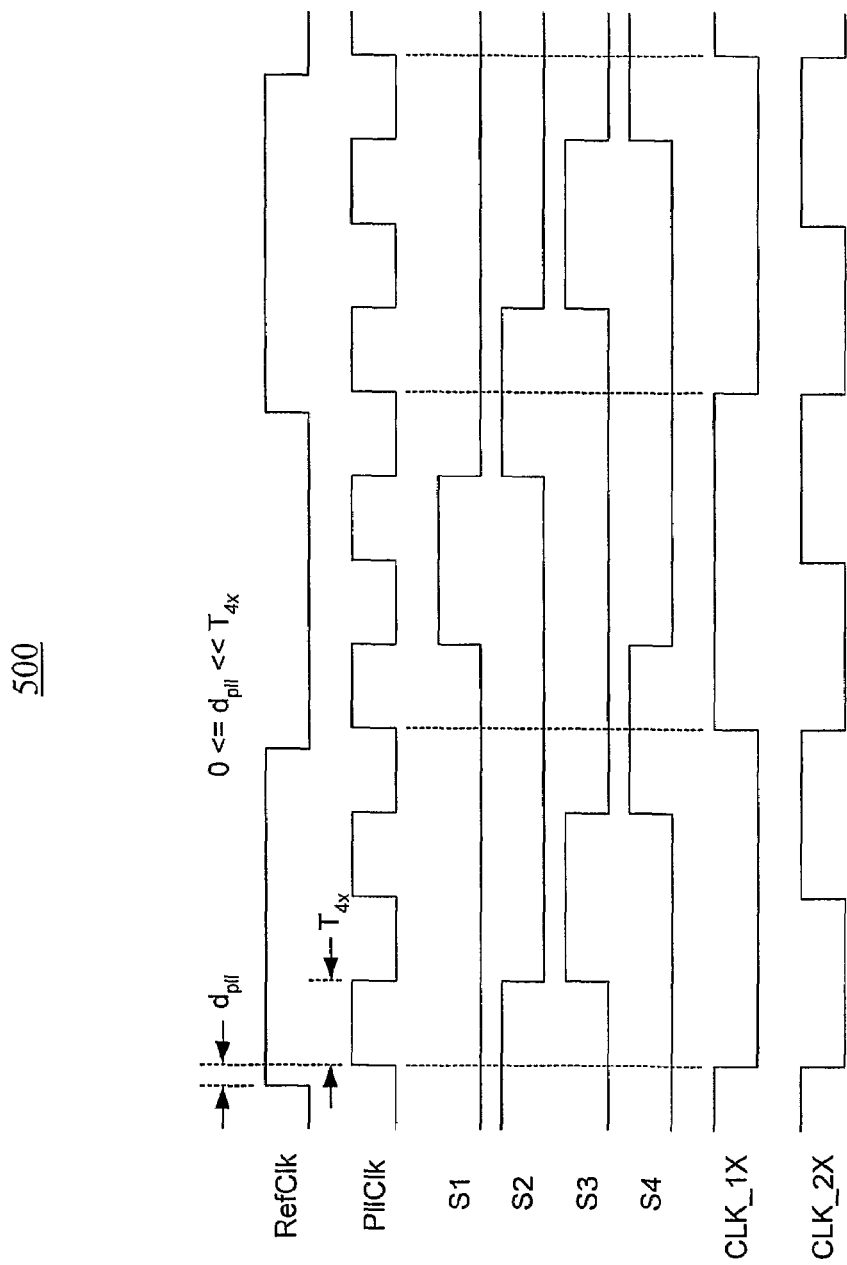
FIG. 5 is a timing diagram of the clock divider circuitry according to an exemplary embodiment of the present invention.

Referring to FIG. 5, a timing diagram of the clock divider circuitry according to an exemplary embodiment of the present invention is shown. The timing diagram shown represents the signal state at indicated points on the clock divider circuitry of FIG. 4 400.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

The invention claimed is:

1. An apparatus comprising:
    an analog to digital converter for generating a digital signal in response to a first clock signal;
    a fixed rate clock generator for generating said first clock signal;
    a phased lock loop for generating a second clock signal in response to said first clock signal;
    a delay means comprising a plurality of outputs for delaying the first clock signal responsive to the second clock signal;
    a means to compare said plurality of outputs of the delay means to produce a first output signal, wherein the first output signal produced is a synchronization of the first clock signal and the second clock signal; and
    a processing means to process said digital signal in response to said first output signal.

2. The apparatus of claim 1 wherein the delay means comprises a plurality of flip-flops.

3. The apparatus of claim 1 wherein a plurality of comparisons are made between a plurality of the outputs of the delay means to produce multiple output signals.

4. The apparatus of claim 1 wherein the output signal is a clock signal with a 50% duty cycle.

5. An apparatus comprising:
    a first input to receive a first clock signal;
    a second input to receive a second clock signal;
    an output;
    a first flip-flop wherein the first clock signal is connected to a data input of the first flip-flop and the second clock signal is connected to a clock input of the first flip-flop;
    a second flip-flop wherein an output of the first flip-flop is connected a data input of the second flip-flop and the second clock signal is connected to a clock input of the second flip-flop;
    a third flip-flop wherein an output of the second flip-flop is connected a data input of the third flip-flop and the second clock signal is connected to a clock input of the third flip-flop;
    a fourth flip-flop wherein an output of the third flip-flop is connected a data input of the fourth flip-flop and the second clock signal is connected to a clock input of the fourth flip-flop;
    a fifth flip-flop wherein an output of the fourth flip-flop is connected a data input of the fifth flip-flop and the second clock signal is connected to a clock input of the fifth flip-flop;
    a first AND gate where the output of the first flip-flop is connected to a first input of the first AND gate and the output of the second flip-flop is connected to a second input of the first AND gate;
    a second AND gate where the output of the fourth flip-flop is connected to a first input of the second AND gate and the output of the fifth flip-flop is connected to a second input of the second AND gate;
    a first or gate where the output of the first AND gate is connected to the first input of the first OR gate and the output of the second AND gate is connected to the second input of the first OR gate; and
    a sixth flip-flop where the output of the first OR gate is connected to the D input of the sixth flip-flop and the second input is connected to the clock input of the sixth flip-flop and the output of the sixth flip-flop is connected to the output of the apparatus for producing a first output signal.

6. The apparatus of claim 5 wherein the first output signal produced is a synchronization of the first input signal and the second input signal.

7. The apparatus of claim 6 wherein the first clock signal at the first input is a fixed rate clock signal and the second clock signal at the second input is a clock signal derived from a phase locked loop.

8. The apparatus of claim 7 wherein the first output signal is a clock signal with a 50% duty cycle.

9. A method for processing an analog signal comprising the steps of:
    generating a first digital signal from a first analog signal in response to a first clock signal;
    generating a second clock signal in response to said first clock signal;
    passing said first clock signal through a delay means having a plurality of outputs wherein said delay means is responsive to said second clock signal;
    comparing two or more of the plurality of outputs of the delay means to produce a first output signal wherein the first output signal produced is a synchronization of the first clock signal and the second clock signal; and
    processing said first digital signal in response to said first output signal.

10. The method of claim 9 wherein the comparing of two or more of the plurality of outputs of the delay means is performed using logic devices.

11. The method of claim 9 wherein the comparing of two or more of the plurality of outputs of the delay means is performed using software.

12. The method of claim 9 wherein the signal at the first clock signal is a fixed rate clock signal and the second clock signal is a clock signal derived from a phase locked loop.

13. The method of claim 9 wherein the delay means comprises a plurality of flip-flops.

14. The method of claim 9 wherein a plurality of comparisons are made between a plurality of the outputs of the delay means to produce multiple output signals.

* * * * *